(12) United States Patent
Portka et al.

(10) Patent No.: US 11,274,364 B2
(45) Date of Patent: Mar. 15, 2022

(54) SPUTTER DEVICES AND METHODS

(71) Applicant: Solayer GmbH, Kesselsdorf (DE)

(72) Inventors: Martin Portka, Wörth am Main (DE); Markus Kress, Mühlheim am Main (DE); Michael Geisler, Wächtersbach (DE); Florian Peter Schwarz, Aschaffenburg (DE)

(73) Assignee: Solayer GmbH, Kesselsdorf (DE)

( * ) Notice: Subject to any disclaimer, the term of this patent is extended or adjusted under 35 U.S.C. 154(b) by 786 days.

(21) Appl. No.: 16/019,953

(22) Filed: Jun. 27, 2018

(65) Prior Publication Data

US 2019/0003039 A1    Jan. 3, 2019

(30) Foreign Application Priority Data

Jun. 28, 2017 (DE) .......................... 102017114373.4

(51) Int. Cl.
| | |
|---|---|
| *C23C 14/54* | (2006.01) |
| *C23C 14/34* | (2006.01) |
| *H01J 37/34* | (2006.01) |
| *C23C 14/56* | (2006.01) |
| *C23C 14/04* | (2006.01) |
| *C23C 14/35* | (2006.01) |
| *H01J 37/32* | (2006.01) |

(52) U.S. Cl.
CPC .............. *C23C 14/54* (2013.01); *C23C 14/04* (2013.01); *C23C 14/3464* (2013.01); *C23C 14/352* (2013.01); *C23C 14/562* (2013.01); *H01J 37/32449* (2013.01); *H01J 37/32541* (2013.01); *H01J 37/32715* (2013.01); *H01J 37/3405* (2013.01); *H01J 37/3417* (2013.01); *H01J 37/3435* (2013.01); *H01J 2237/3323* (2013.01)

(58) Field of Classification Search
CPC ..................................................... C23C 14/568
USPC ........................................ 204/298.21, 298.22
See application file for complete search history.

(56) References Cited

U.S. PATENT DOCUMENTS

| | | | |
|---|---|---|---|
| 4,356,073 A | 10/1982 | McKelvey | |
| 6,336,999 B1 * | 1/2002 | Lemmer | ............... C03C 17/002 |
| | | | 204/192.12 |

(Continued)

FOREIGN PATENT DOCUMENTS

| | | |
|---|---|---|
| CN | 1693532 A | 11/2005 |
| CN | 102934197 A | 2/2013 |

(Continued)

*Primary Examiner* — John J Brayton
(74) *Attorney, Agent, or Firm* — Dascenzo Gates Intellectual Property Law, P.C.

(57) ABSTRACT

Sputter devices comprise a vacuum supply, a gas supply, a substrate holding device, and sputter sources. Each sputter source is held by an individual source support, each of which has an individual reference point allocated on a sputter surface facing the deposition area, and each of which has a source distance to a source reference surface from the individual reference point. The sputter sources are spaced apart from each other, are arranged as a two-dimensional array opposite the deposition area, and extend along the source reference surface. The source reference surface is parallel to the substrate reference surface. At least one of the sputter sources has a source distance deviating from zero.

18 Claims, 6 Drawing Sheets

(56) References Cited

U.S. PATENT DOCUMENTS

| | | | |
|---|---|---|---|
| 6,365,010 B1 * | 4/2002 | Hollars | C23C 14/35 |
| | | | 204/192.12 |
| 8,137,510 B2 * | 3/2012 | Bangert | H01J 37/3405 |
| | | | 204/192.12 |
| 9,771,647 B1 * | 9/2017 | Scobey | C23C 14/352 |
| 2003/0085122 A1 * | 5/2003 | Takahashi | H01J 37/3435 |
| | | | 204/298.23 |
| 2005/0199492 A1 * | 9/2005 | Takahashi | H01J 37/32889 |
| | | | 204/298.12 |
| 2012/0006266 A1 | 1/2012 | Lim et al. | |
| 2016/0254127 A1 | 9/2016 | Vergöhl et al. | |

FOREIGN PATENT DOCUMENTS

| | | |
|---|---|---|
| DE | 102013221029 A1 | 4/2015 |
| WO | WO 2021/041557 A1 | 4/2012 |

* cited by examiner

SPUTTER DEVICES AND METHODS

RELATED APPLICATION

This application claims priority under 35 U.S.C. § 119 to German Patent Application No. 102017114373.4, which was filed on Jun. 28, 2017 and entitled "Sputtervorrichtung and Sputterverfahren zur Beschichtung von dreidimensional geformten Substratoberflächen," and the complete disclosure of which is incorporated by reference.

FIELD

The present disclosure relates to sputter devices and methods.

BACKGROUND

Sputter devices typically generate a process atmosphere within a deposition section, which can be one of several deposition sections. For example, at least one vacuum supply may generate a vacuum within the deposition section, and a gas supply may introduce a process gas required for the sputter process. The process gas may be made of an inert working gas or may be a combination of the working gas and further gases, such as reactive gases or other technologically related gases. Known is the introduction of a prepared gas compound or the separate introduction of gases required for producing the process gas.

Further, sputter devices commonly have a substrate holding device and one or more sputter sources for the provision of vaporous deposition materials. The substrate and the sputter source(s) are positioned opposite each other within the deposition section in such a way that the deposition material is deposited on the substrate surface within a deposition area.

The deposition area generally is considered to be the area on a substrate surface, from which there is a visual contact to the area of the target during the sputtering, from which material is sputtered, so that sputtered material, and not predominantly scattered steam, is deposited in this area of the substrate surface due to process-specific and influenceable distribution characteristic. In relation to three-dimensionally shaped substrate surfaces, surface sections, such as side and rear surfaces analogous to flat substrates, are not included as they do not have visual contact to the target as a result of the holding of the substrate. Sometimes, but often not desired, the substrate is turned over to coat this surface in a subsequent sputter process.

During the sputtering, a plasma, whose positive charge carrier will ablate the upper layers of a target surface arranged on the cathode through a so-called sputter effect (i.e. ion-bombardment-induced ejection of atoms from the solid surface), is ignited within the process gas between the substrate to be coated and a sputter source operated as cathode. Metals can be sputtered with or without reactive gases present, and in regards to the former, oxide or nitride can be deposited on one of the ablation surfaces of the substrate opposite to the target. Similarly, it also is possible to use and sputter other metal compounds.

In order to support the formation of plasma as well as the acceleration of the ions on the target surface, a magnet system with adjacent magnets with locally changing polarity is arranged on the side of the target facing away from the plasma. As is well known, such a magnet system, as is used for magnetron sputtering, consists of a central magnetic pole, which is surrounded by a second opposite magnetic pole in the shape of a ring. Due to the tunnel-shaped magnetic field that forms as a ring, the target material is ablated over the gap between two magnetic poles, where the magnetic field lines run parallel to the target surface, so that an annular sputter trench is formed within this area. This is also referred to as racetrack, and the used sputter source as magnetron. The local course of the plasma ring, which is magnetically guided and which is closed within itself, correlates with the erosion of the target material.

Planar and tubular sputter sources are known, whereby the latter typify the deposition processes with high target utilization and are particularly suitable for the deposition on large-surface substrates or for the continuous deposition.

Tubular targets comprise a cylindrical cathode, which can be rotated around its longitudinal axis. The shell surfaces of these tubular cathodes are made of sputterable target material, whereby the target material can be either a tubular target, so that the cylinder of the tubular cathode is made entirely of the material to be sputtered, or the tubular cathode is made of a support tube, which has the material to be sputtered deposited on. Regardless of the respective embodiment, it is commonly referred to as a tubular target or tube target.

The magnet system is commonly arranged in the inner space of a tube target and extends across the entire length of the tube target. The racetrack, which is formed on the shell surface of the tube target, extends parallel to the tube target's longitudinal axis and across its entire length. The tube target is rotatable in relation to the arrangement of the magnets, so that the tube target can rotate as the deposition is in operation, while the arrangement of magnets in the deposition chamber remains aligned in the same way. By means of a uniform rotation of the tube targets in case of a stationary magnetic field, the entire cylindrical target surface passes through the racetrack area, and an even erosion of the target material is achieved.

In the following description, the target surface, which is exposed to the plasma and which supplies the sputter material to the opposite substrate, is referred to as the sputter surface. In the case of planar sputter sources, this remains the same surface at all times, if the material ablation remains to be disregarded, whereas in the case of the tubular sputter sources, the area of the shell surface acting as sputter surface constantly shifts on the shell surface due to its rotation.

The deposition of three-dimensionally shaped surfaces of substrates by means of sputtering is based on the fact that its surface points do not lie in one, but several parallel planes in comparison to planar substrate surfaces, as it is known from panel-shaped and strip-shaped substrates. This means that the substrate surface can have, for instance, curvatures, depressions or height jumps. The resulting differences in the distance between different areas of the substrate surface and the opposite sputter surface can have a considerable impact on the result of the deposition, specifically on the thickness and further characteristics of the deposited layers, which is often not acceptable.

Coated three-dimensionally shaped substrate surfaces are needed for different applications, such as for electrochromatic applications, thermal insulation and solar control glazing, contact or heating surfaces, photovoltaics, displays and others.

In order to achieve a deposition of three-dimensionally shaped surfaces with sufficient homogeneity, motion units are utilized in known methods and deposition devices, which produce three-dimensional relative movements of the sputter source and substrate. Deposition devices with several sputter sources, which are arranged in relation to each other in such a way that they form a hollow cylindrical environment, within which a substrate is arranged to be coated from several directions, are also known.

The disadvantage of the known deposition devices is that only those surface units of the substrate surface can evenly be coated which, either due to their arrangement or during movements of the sputter source, are opposite to the sputter source with on average the same time and the same orientation. It follows that in regards to hollow-cylindrical source arrangements, only flexible substrates to be transported on a roll or only rigid substrates with such inclinations or curvatures of the substrate surface are to be coated in a homogenous manner that run essentially parallel to the shell surface of the hollow cylinder of the source arrangement.

During the execution of relative movements between the sputter source and substrate, very complicated motion sequences are required for more complex surface geometries. For instance, for concave or convex surfaces, an inclination of the rotation axis is necessary, besides the rotation, and is always subject to said temporal averaging of the deposition position. Components of the motion devices in addition are arranged within the deposition chamber, and thus, are exposed to the deposition material to such an extent, that requires an elaborate protection and an extensive maintenance of these components.

Furthermore, such deposition devices are limited to small substrate sizes as the dimensions and costs of the entire system can only be kept within economically justifiable limits for small substrate sizes.

SUMMARY

Sputter devices and methods are disclosed. In some examples, a sputter device for sputtering deposition of a layer on a three-dimensionally shaped substrate surface of a substrate in a deposition area comprises, in a deposition section of the sputter device, at least one vacuum supply for generation of a vacuum in the deposition section, a gas supply for introduction of process gas for the sputtering deposition in the deposition section, a substrate holding device for support of the substrate relative to a substrate reference surface of the substrate holding device, and sputter sources. Each sputter source is held by an individual reference support. Each sputter source has an individual reference point allocated on a sputter surface facing the deposition area. Each sputter source has a source distance to a source reference surface from the individual reference point. The sputter sources are spaced apart from each other, are arranged as a two-dimensional array opposite the deposition area, and extend along the source reference surface. The source reference surface is parallel to the substrate reference surface. At least one of the sputter sources has a source distance deviating from zero.

In some examples, a sputter device for sputtering deposition of a layer on a three-dimensionally shaped substrate surface of a substrate in two deposition areas comprises, in one or two deposition sections of the sputter device, at least one vacuum supply for generation of a vacuum in each deposition section, a gas supply for introduction of a process gas for the sputtering deposition in each deposition section, one or two substrate holding devices for the support of the substrate relative to each substrate reference surface of each substrate holding device, and tubular cathodes as sputter sources. Each sputter source is held by one individual source support. Each sputter source has an individual reference point allocated on a sputter surface facing the deposition area. The sputter sources are arranged as two one-dimensional arrays of tubular magnetrons that are parallel and adjacent to each other and that are spaced apart from each other. Axial directions of the tubular magnetrons of both arrays, along the transport path of the substrate between the two deposition areas, have a rotation angle β in relation to each other which ranges from 0° to 90°. Each array is opposite one deposition area of the two deposition areas, and each extends along a source reference surface that passes through at least one reference point of the sputter sources of the respective array. The source reference surface is parallel to the substrate reference surface. At least one of the sputter sources has a source distance to the source reference surface deviating from zero.

DESCRIPTION

Figure 1:
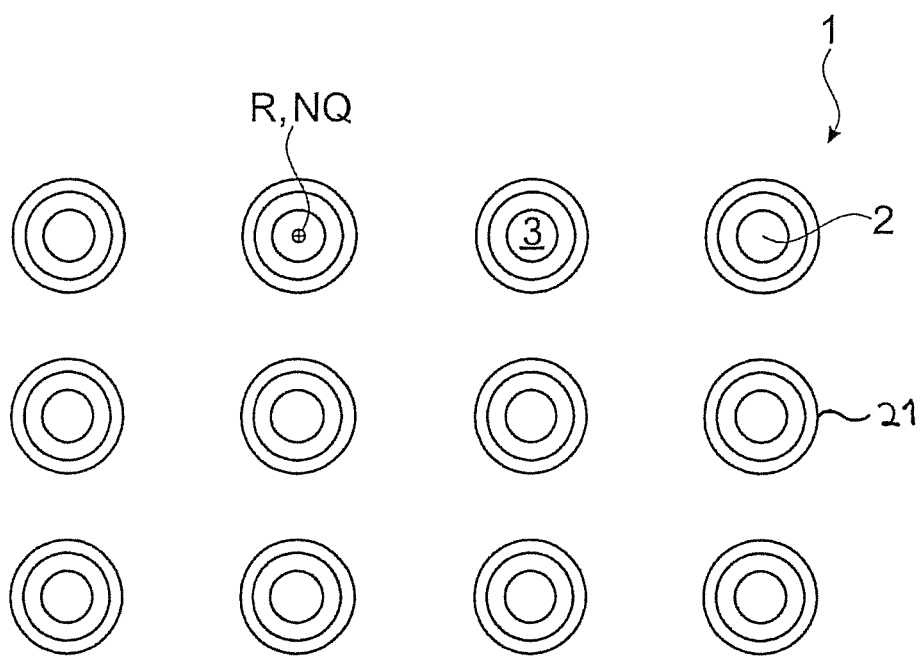
FIG. 1 is a schematic representation of an example two-dimensional array of sputter sources of a sputter device.

An object of the present disclosure is to present a sputter device and a sputter method to be carried out therewith, through which depositions of three-dimensional substrate surfaces are possible in such a way that such relative movements between the sputter source and the substrate, which merely serve the homogenizing of the layer to be coated, are not needed during the deposition.

According to the disclosed devices and methods, layers, which have a homogenous or defined distribution of layer characteristics across the surface, such as layer thickness, adhesion, optical or electrical characteristics, shall be produced without the need of such compensating movements.

Further, such methods and devices shall be applicable for both discontinuous depositions with a static position of the substrate, for instance as it is realized in batch or cluster systems or in discontinuously depositing conveyorized systems, and continuous depositions, during which substrates are continuously transported through a deposition system and are coated in the process.

Further, known types of sputter sources shall be applicable to devices and methods according to the present disclosure, i.e., both planar and tubular sputter sources.

Sputter devices according to the present disclosure are described in which the surface of the deposition area, and thus, the three-dimensionally shaped surface of the substrate to be coated simultaneously or several thereof, is referred to as the substrate surface. The substrate surface may be described as being divided into sub-areas, with each sub-area assigned its own sputter source, whose height is adjusted to the elevation of the sub-area of the substrate surface. The individual sputter sources act as one sputter source as they present the partitioning of the entire sputter surface into sub-surfaces, whose distance to the opposite lying sub-areas of the substrate surface, and thus, its height profile can be adjusted.

For this purpose, sputter devices according to the present disclosure may comprise several sputter sources of the same kind or alternatively of a different kind, which each are held by an individual source support. The sputter sources may be arranged as a two-dimensional array or as a one-dimensional array, are each spaced apart from one another in the array, and may have elevations deviating from each other; however, at least one sputter source has such an elevation that differs in relation to the others. The type, amount, and design of the sputter sources are a question of optimization as a greater number of smaller sources improves the homogeneity of the layer, while larger sources are operated in a more stable manner.

The sputter sources may be described as being of the same kind if they are at least of the same type, i.e., all of them planar or all of them tubular shaped, and all of them are realized as a sputter cathode or alternatively with a magnet system as magnetron. An array of sputter sources of the same kind therefore comprise at least one sputter source of another type. Through selection of the type, the distribution of the emission rate can be influenced. In this way, planar sputter sources have a higher plasma density, and thus, a higher emission rate than tubular shaped sputter sources. The latter, however, have a larger distribution angle. Therefore, a specific distribution of different sputter source types in the array can also have an influence on a homogenous or specific distribution of the deposition.

The sputter sources can have uniform or different geometries and dimensions, depending on the extent of curvatures or jumps and in relation thereto fictitious surface division. The term sputter source implies that each source is designed in such a way that it can be operated and controlled independently from the others.

An array is generally referred to as an arrangement of elements. A one-dimensional array therefore is understood as a row of elements and a two-dimensional array is understood as a field of elements, which expands in two directions.

For a clear definition of the elevation of the sputter sources in relation to each other and in relation to the substrate surface, a reference system consisting of surfaces and points is used, which orientates itself on the substrate support and the sputter surface.

A first reference surface defines the position of the substrate and its orientatation, for instance, on the substrate holding device. The reference surface is referred to as the substrate reference surface and is defined in such a way that it is geometrically related to the substrate surface. For instance, a support surface for or in the substrate support, or a surface, within which the substrate support is moved through a handling or transport system, is suitable as the substrate reference surface. The substrate reference surface itself may be curved, as known from a transport drum, or may be flat, as known from a conveyor belt of a deposition conveyorized system.

If the shape of the to-be-coated substrate is known, which is the case at least when executing a method according to the present disclosure or when simulating the deposition by a device according to the present disclosure, as described subsequently when determining a characteristics curve map (also known as characteristics map or characteristics field) and/or a transfer function, this reference surface (i.e., the substrate reference surface) can be optimally related to the surface shape of the substrate, and thus, an improved adjustment of the distance of each source of the array on the opposite lying sub-areas of the substrate surface can be carried out.

A second reference surface, which serves to describe the position of the sputter sources and is called source reference surface, has a homogenous surface distance relative to the substrate reference surface (i.e., the source reference surface is parallel to the substrate reference surface). It is therefore corresponding to the substrate reference surface, e.g., flat or curved and runs through at least one reference point of the sputter sources of the array. The source reference surface may be an imaginary surface, in so far as it does not necessarily coincide fully with physical surface points of the sputter sources, but rather extends through reference points of the sputter sources, such that the second reference surface is effectively parallel to the substrate reference surface.

The reference point of each sputter source lies within the sputter surface of the sputter source in accordance with the above definition and can be defined for all sputter sources, so that a clear positional reference of the sputter sources relative to each other can be established. It is advantageous to select the same reference points for the same types of sources and to select corresponding reference points for different types of sources. For instance, a corner point or the center point of planar sputter sources, or an end point or the center point of the respective shell surface of a tubular source that lies closest to the substrate surface can be used, or similar points that are clearly to be defined in each sputter source.

The distance of the sputter surface in relation to the source reference surface, referred to as source distance, and therefore also in relation to the substrate surface, is thus to be defined clearly for all sputter sources of the array by way of the reference point. Through determining the height position of the sputter sources by way of the sputter surface, the material ablation on the sputter surface may in addition be taken into account during the deposition.

Optionally, the height adjustment of the sputter surfaces to the profile of the substrate surface can be added through inclining the sputter sources, so that its normal falls at least close to perpendicular onto the associated sub-area of the substrate surface. By inclining at least one sputter source, with a preference for those sputter sources that are opposite an inclined sub-area of the substrate surface, so that its orientation (i.e., the mean of the directions of emission of the layer-forming particles emitted by the sputtering surface) without inclination does not cause an unacceptable reduction of the deposition rate, an adjustment of the orientations of the individual sputter sources to the profile of the substrate surface takes place. Such an added adjustment leads to a further homogenization or precise adjustment of the distribution of the layer characteristics.

On the device side, the normal of the sputter surface of an inclined sputter source in relation to the normal of the source reference surface has an inclination angle $\vartheta$, which ranges from 0° to smaller than 90°. In some examples, it may be preferable that the inclination angle $\vartheta$ ranges from 0° to 45°. The normal of the sputter surface originates at the reference point of the sputter surface and the normal of the source reference surface originates at the section of the source reference surface that is to be assigned to the respective sputter source, preferably from the center point of the section. The number of inclined sputter sources is determined by way of the profile of the substrate surface. The selection of the angle ϑ depends, among other things, on the degree of adjustment of the substrate reference surface to the surface shape of the substrate. If both substantially correspond to each other, or if the substrate surface has jumps close to each other, in relation to the size of the sputter surface of the opposite sputter source, an angle ϑ of 0° or only slightly deviating from this can suffice.

Alternatively or in addition to the inclination, tubular magnetrons also offer a method of pivoting the magnet system within the source around the axis of the tubular magnetron, through which the main sputter directions of the racetrack halves, also relative to each other, can be relatively modified. The angle, around which the magnet system as a whole or its magnetic poles relative to each other are pivoted, shall be designated as pivoting angle ϑ for better distinction.

Alternatively or in addition, a sputter source of the array can be rotated about its normal. Also through the rotation of one or more sputter sources in the array, the deposition rate can be influenced locally.

In accordance with further embodiments of the device, the source distance or the inclination angle ϑ or the pivoting angle of the magnet system ϑ or a combination of these variations of a sputter source or several thereof or all at least by way of their source support(s) may be varied and/or at least one sputter source may be rotated around an axis, which extends through its reference point. It is advantageous if the source supports allow adjustments to be made that are independent of each other.

The height adjustment of the individual sputter sources to the three-dimensional shape of the substrate surface, which can optionally be supplemented by inclining the sputter source, allows the deposition to be executed without the relative movement, known from the state of the art, between source and substrate during the deposition while still achieving the desired homogeneity or distribution of the layer characteristics.

In accordance with the present disclosure, the sputter sources in the array are arranged at a distance to each other. Thus, a homogenous process atmosphere of the desired composition can be achieved within the space between sputter sources and substrate surface. According to the distances, the source design and possible installation in the process area, the pumping units, and pumping outlets are to be configured in such a way that the inlet of the sputter sources act as a significantly interfering resistance for the process gas flow that builds up in the process chamber.

This is particularly important to take into consideration if the vacuum connections are arranged behind the array or rather behind each array of the sputter sources according to the embodiment of the device and, if necessary, are distributed there. The latter contributes to the homogenization of the plasma and thereby the deposition. Optionally, within the space between a vacuum connection or several thereof and the sputter sources, mobile or stationary baffles are arranged.

Also, the gas supply, which comprises the necessary components in order to introduce and produce a process gas necessary for the sputter process within the deposition section, specifically the distribution of the gas inlets in the deposition is to be executed subject to these conditions. According to one embodiment, the gas supply comprises one or more reactive gas inlets and has a reactive gas supply line, which has a reactive gas inlet adjacent to a sputter source, preferably to each sputter source. In this way, the adjustment of the process gas to the individual sputter sources of the array can take place, and the gas diffusion, through which the array elements are connected to each other, can be influenced. Dependent on different parameters, such as the size of the sputter sources, their distance to each other, the composition of the process gas, the realization of the gas compound, and more, another ratio of the number of gas inlets to the number of sputter sources can be selected. A measure of the arrangement of a gas inlet that is adjacent to a sputter source may be the following: The gas inlet under consideration shall be considered to be adjacent to the sputter source at such a distance, if the distance is smaller than to any other source. In this way, a gas inlet may be adjacent to several sputter sources if it is at the same distance to the sources while taking into account the common dimensional tolerances.

Deposition devices according to the present disclosure may be used in known types of deposition systems, batch, cluster, and conveyorized systems and for horizontal and vertical or inclined substrate alignments. In conveyorized systems, the static deposition with discontinuous substrate transport or the dynamic deposition with continuous substrate transport can be used. Also, the known operating modes of sputtering, such as sputtering in a reactive or non-reactive atmosphere, DC, AC, MF, RF, sine wave, pulse, HIPMS sputtering, or others can be used. The known measures to avoid arcing also can be used.

If the curvatures are positioned in such a way that they are not sufficiently coated when the substrate is transported past the array during the conveyorized deposition methods, two or more differently operated or differently designed arrays can be combined along the transport path. For differently operated arrays, arrays can be used according to the above description, even for similarly constructed arrays, of which only ever the sputter sources are adjusted and operated, with which only the sub-areas of the substrate surface are to be coated which have the same curvature direction in the center.

Alternatively, differently designed arrays can be used. For instance, two, alternatively also more, arrays of tubular magnetrons can be arranged parallel to each other and spaced apart from each other. These would be considered one-dimensional arrays, although the joint sputter surface expands in two directions. In order to be able to adapt the height of individual sputter sources to different curvature directions, both axial directions of the tubular magnetrons of both arrays, with respect to the transport path of a substrate from one into the second deposition area, enclose a rotation angle β which ranges from greater than 0° to 90°, depending on the position of the different directions of curvature. Each array can be adapted to the height profile of the substrate surface independently from each other, as described above. Also, an inclination of the sputter surface is possible through inclining of the magnet system in the tube cathode around the inclination angle ϑ, so that the racetrack and thus the orientation of the magnetron around this angle on the shell surface of the tube are shifted.

The relation of the angle of rotation to the transport path that a substrate has to travel to get from the first to the second deposition area comprises different, but analogous to each other, designs. So, in the case of a linear transport path that is regularly realized in conveyor systems, the substrate is rotated around the rotation angle β or the transport path itself is pivoted around this angle. A combination of both is also possible. In general, a pivoting of the array would also be possible; however, due to the complex construction of the arrays with the source environment, such as voltage, cooling, baffles, gas supply, etc., on an industrial scale, a pivoting array may be complex.

If a substrate passes through both deposition areas of the arrays successively along its transport path, the different curved surfaces are coated on by way of rotating the substrate around an axis that is perpendicular to the substrate reference surface, which in this case is the substrate transport plane, or by way of changing the direction of the transport path between both deposition areas. On the device side, this can be achieved with a substrate holding device for both deposition areas or alternatively with a separate substrate holding device for each deposition area.

Such an embodiment can be used for such substrate geometries that have two or more main curvature directions, whose tangents define two or more main directions and enclose an angle. This angle corresponds with the angle β of the axial directions of the sputter sources of the arrays, so that the orientation of the main curvature directions of the substrate along the transport path of the substrate is adapted to the orientation of the array. For instance, such a realization is suitable for substrate geometries whose curvatures are small relative to the expansion of the substrate. Such substrates are used, among other things, in glazing for motor vehicles.

By way of the deposition device described above, small and large substrate surfaces are to be coated. Substrate surfaces are defined as large if the projections of the substrate surface to be coated and the area on the same plane from which sputtered material can be provided, for instance the horizontal or vertical plane in which the substrate is held, at least approximately correspond to each other, or the substrate projection is larger than the other.

The adaptability of the profile of the jointly operated sputter sources to the profile of the substrate surface may be variable if the adjustment of the source distances and/or the angle of inclination of at least two sputter sources are carried out independently of each other.

Besides the geometry of the sputter sources of the array, the process parameters themselves and the prevention of the arcing have a considerable effect on the result of the deposition. Therefore in one embodiment of deposition methods according to the present disclosure, the sputter sources of an array are operated at the same operating point (such as described by the deposition rate and/or gas inflow and/or cathode power). According to the present disclosure, which demonstrates deposition by way of an array of sputter sources adaptable to the sputtering result, two sputter sources operate at the same operating point when the reactive gas mass flow and the power are in the same or at least nearly the same ratio, so that layers of practically the same stoichiometry and/or practically the same refractive index are deposited. For instance, this includes different power and different deposition rates of the considered sputter sources.

A good adjustment of the profile of the jointly operated sputter sources and their process parameters can be very difficult even with only slightly curved substrates, such as for the glazing of motor vehicles, due to the numerous interactions and diffusion processes between all sputter sources, specifically also with regard to the uniform operating point. Because the connections cannot be described in a linear manner, causes and effects of changes of individual process conditions are often not clearly identifiable.

In order to achieve an effective and target-oriented adjustment and/or fast control of the sputter sources, the control of the sputter process in one realization of deposition methods according to the present disclosure is carried out on the basis of a characteristics curve map and/or a transfer function (differential equation), which previously were determined by computer-supported simulation or by deposition trials. The simulation may be carried out, for instance, through the known Particle-in-Cell Monte Carlo Concept, a finite element method, which is applied to the plasma limited by the substrate and sputter surfaces and thereby the moving and interacting particles in the smallest spatial units considered. The characteristics curve map and transfer function represent the actual and target state of the deposition depending on a wide range of parameters and can be stored in a central control system for the control of the deposition process. The channels of multi-channel power supplies of the array communicate with each other close to the cathode via the control system. In such examples, communication is relatively fast. Digital control systems can also be used for different applications.

By way of the control system, the arcing management can also be operated, for instance, by dividing the array into pairs of cathodes, which can be operated together with medium frequency.

Instead of the array of sputter sources as described above, spatial or temporal combinations of sputter sources and ion sources may be used, whereby the latter may also be arranged as arrays.

The corresponding drawings in FIG. 1 show a two-dimensional array 1 of circular planar sputter sources 2, each with a size of approximately 7.5 centimeters (cm). The view is directed towards the sputter surface 3. Not shown are the rearward supplies for media, such as gas and electricity. The reference point R and normal NQ of the sputter surface are centric.

Figure 2:
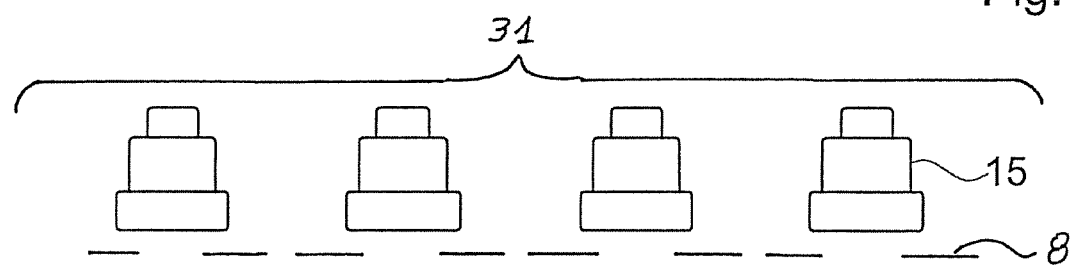
FIG. 2 is a schematic side view representation of an example sputter device.
Figure 2:
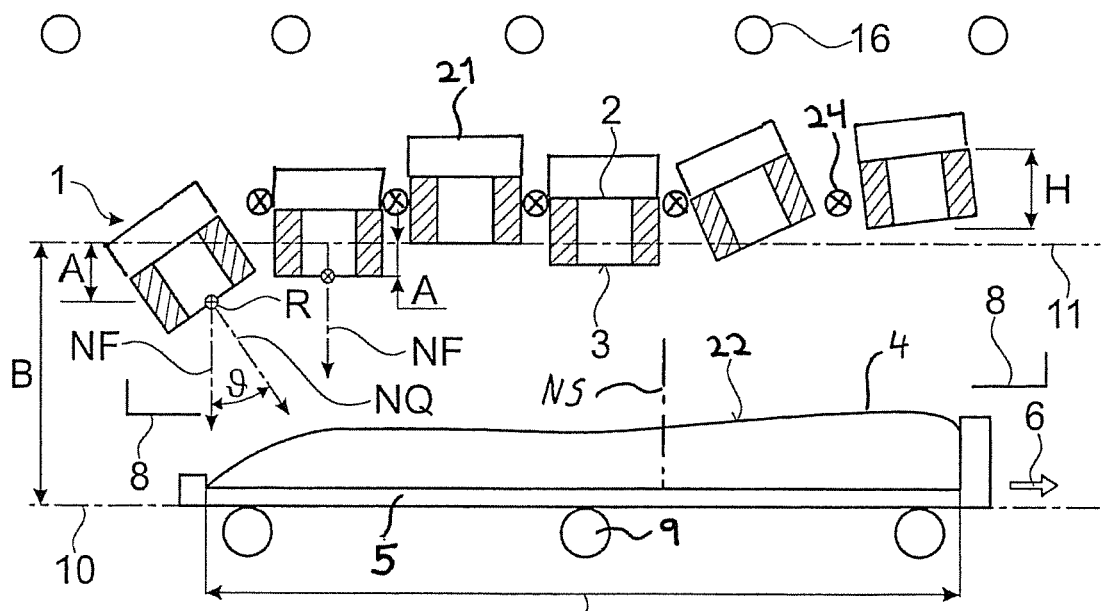

FIG. 2 shows a deposition section 31 including the arrangement of an array 1 of planar sputter sources 2 with their source supports 21 and their sputter surfaces 3 facing the three-dimensionally shaped substrate surface 22 of the substrate 4. The substrate 4 is held flexibly by a substrate holding device 5 in a substrate transport device 9. The deposition area 7 is restricted by (optional) baffles 8.

The arrangement of the sputter sources 2 is presented by way of the substrate reference surface 10, the source reference surface 11, the normal NF of the sputter surface and the normal NQ of the corresponding section of the source reference surface 11, the reference point R, the source distance A, the surface distance B, the inclination angle ϑ, and the expansion H of the sputter source in accordance with the above description. FIG. 2 also shows the normal NS of the substrate reference surface 10 as described below with reference to FIG. 5C.

On the side of the sputter sources 2 which is facing away from the substrate 4, several vacuum supplies 15, which as an example, but not restrictive to, may be realized as turbomolecular pumps, as well as several gas inlets 24 of a gas supply 16 are arranged. The gas supply 16 optionally includes reactive gas inlets 24 adjacent to each sputter source 2. Mobile or stationary baffles 8 are arranged within the space between the vacuum supply 15 and the sputter sources 2.

Figure 3A:
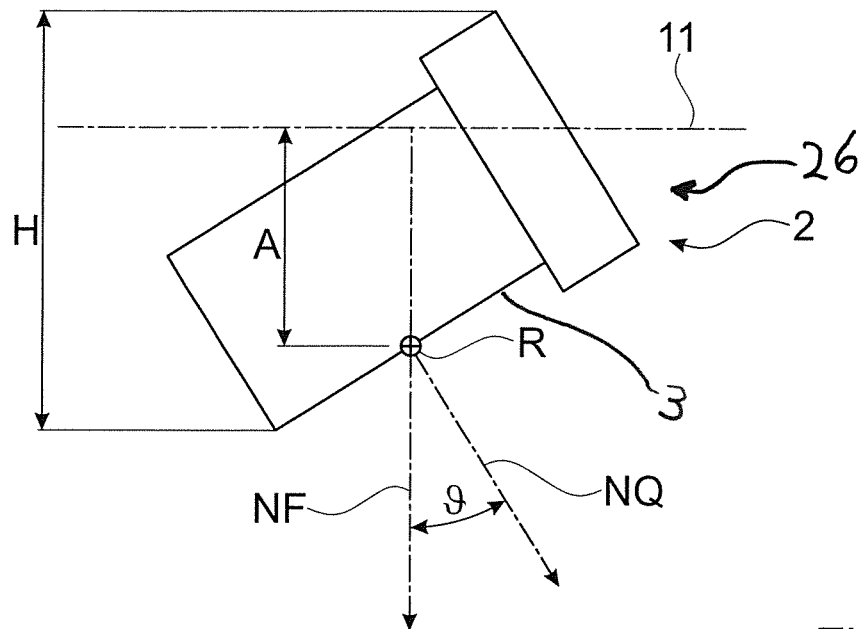
FIG. 3A is a schematic side view representation of an example sputter source in the form of a tubular magnetron of a sputter device.
Figure 3B:
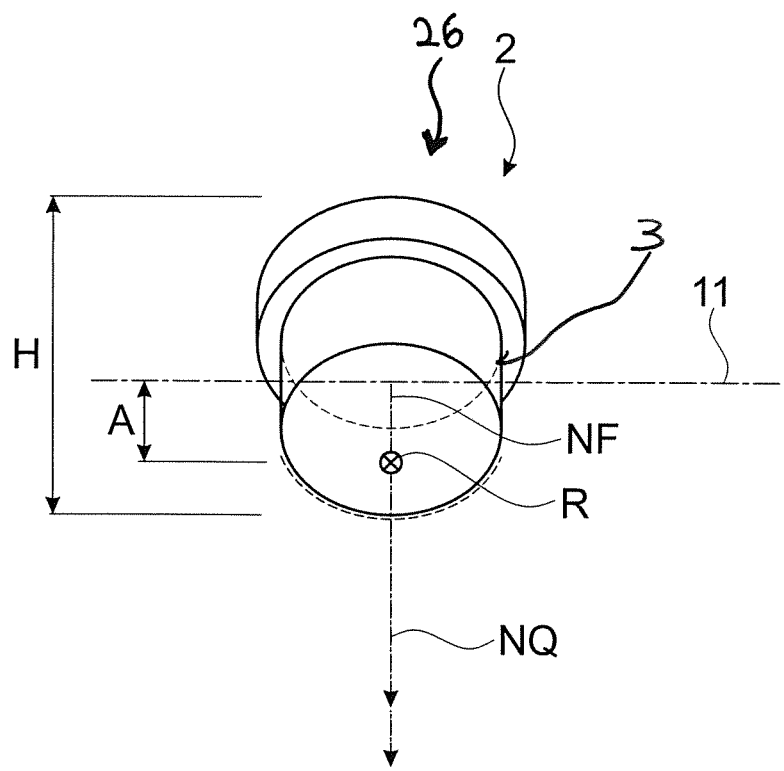
FIG. 3B is a schematic perspective view representation of the example sputter source of FIG. 3A.

FIG. 3A and FIG. 3B show the arrangement of a sputter source 2 (source support is not shown), in this case of a tubular magnetron, relative to the source reference surface 11 with the parameters mentioned for FIG. 2. The drawings show the side view (FIG. 3A) as well as the front view (FIG. 3B). The sputter surface 3 of tubular cathodes 26 is their circumferential surface.

Figure 4A:
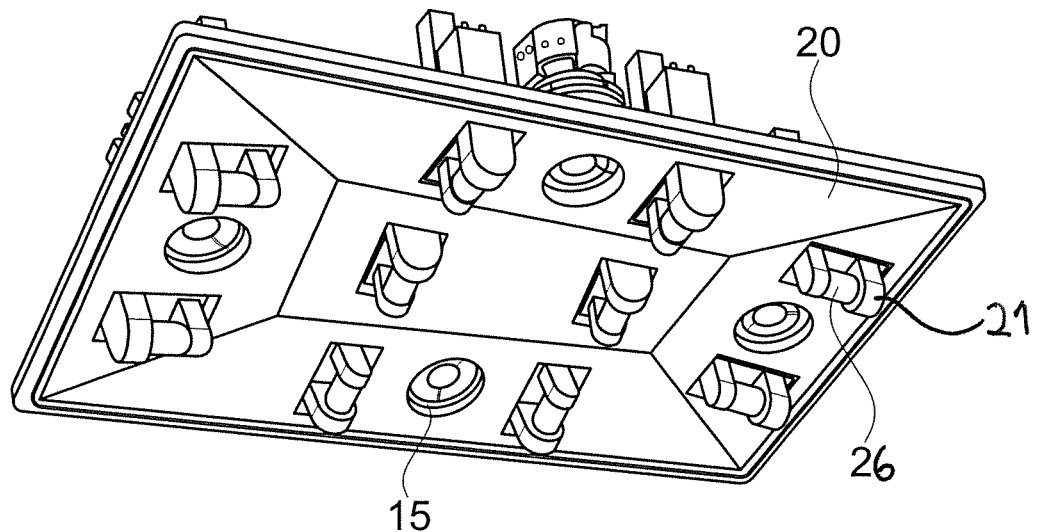
FIG. 4A is a bottom perspective view of a portion of an example sputter device.
Figure 4B:
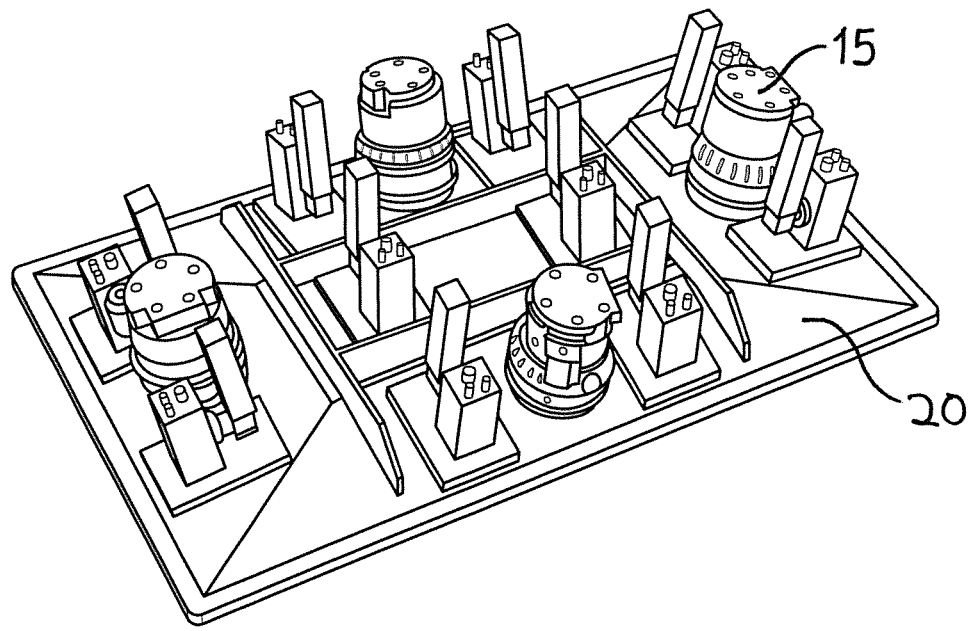
FIG. 4B is a top perspective view of the portion of the example sputter device of FIG. 4A.

FIG. 4A shows the bottom view as a perspective view (from the perspective of the substrate 4—not shown) of one embodiment of one array of tubular magnetrons (sputter sources), which are embedded in and distributed across the surface of a dome-shaped lid 20. Further, several openings are arranged in the lid 20 for vacuum supplies 15. FIG. 4B presents the top view of this lid 20 and its installations. The lid closes a deposition section (not shown).

Figure 5A:
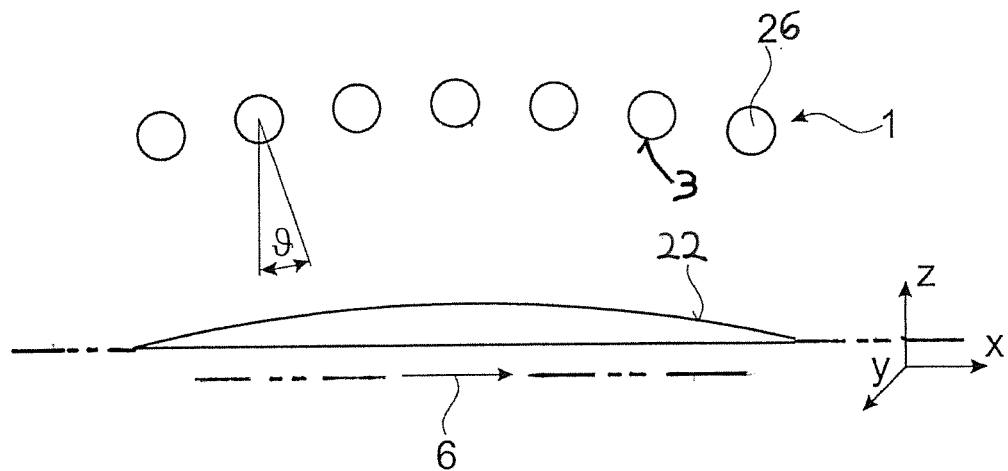
FIG. 5A is a schematic side view representation of an example array of tubular magnetrons of a sputter device positioned relative to a substrate.
Figure 5B:
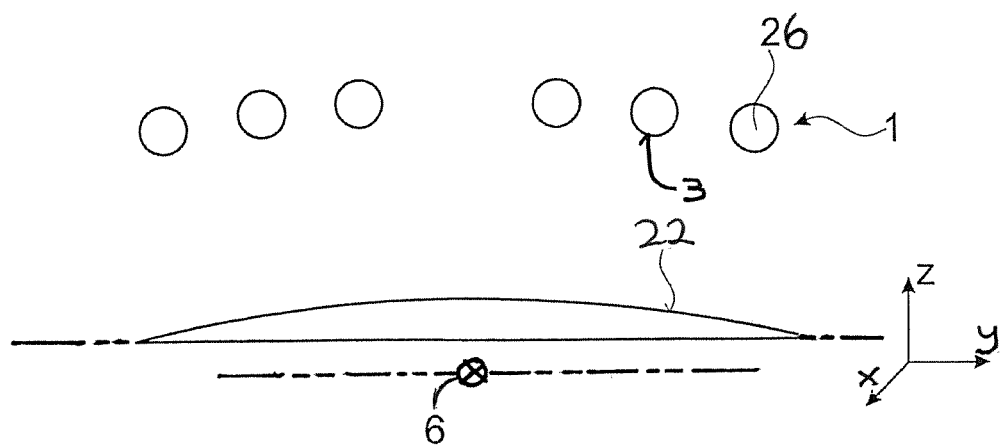
FIG. 5B is another schematic side representation of the example array of tubular magnetrons of FIG. 5B positioned relative to the substrate.

FIG. 5A and FIG. 5B present two successively arranged one-dimensional arrays 1 of tubular cathodes 26, as an example elongated tubular magnetrons, so called rotatables whose length are considerably larger (e.g. within the range of several meters) than their diameter. The substrate surface 22 is curved in both directions, the X as well as Y direction. While the viewing direction at the substrate 4 in FIG. 5A is from the Y-direction, the viewing direction in FIG. 5B is rotated by 90° and runs in the X-direction. This shows that the tubular cathodes 26 of the two arrays 1 are arranged at an angle β of 90° to each other (FIG. 5C as a top view of both arrays 1), which can also be seen from the representation of the substrate transport direction 6.

Figure 5C:
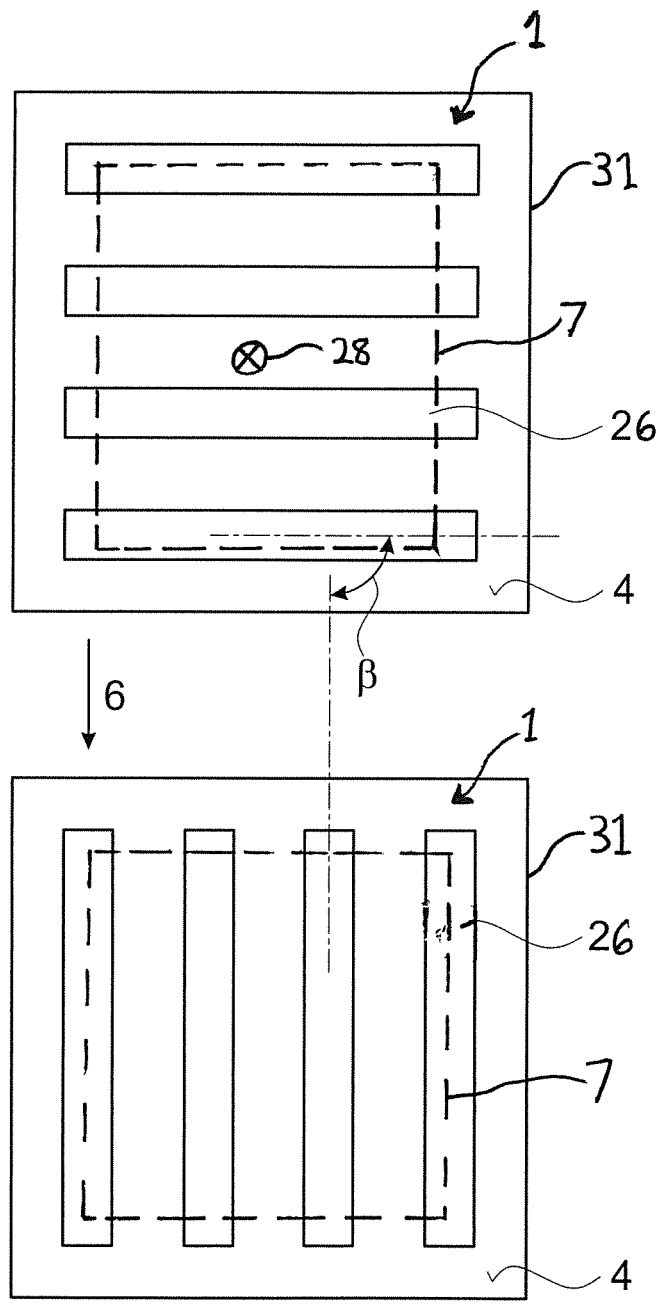
FIG. 5C is a schematic top view representation of an example pair of arrays of tubular magnetrons of a sputter device positioned relative to a substrate.

Further as can be seen in FIG. 5C, the tubular cathodes 26 in this embodiment may, for instance, have a length of 2 meters (m). As mentioned above, the magnetic fields to be measured within the area, where the involved tubular cathodes 26 are discharged, may be adjusted in such a way that those areas of the curved substrate surface 22, FIG. 5B, which are further away from the sputter surface 3, receive a deposition of largely the same rate as those substrate surfaces 22 which are closer to the sputter surfaces 3. In order to adapt the height of the tubular cathodes 26 to the curvature of the substrate surface 22, both axial directions of the tubular cathodes 26 of both arrays, with respect to the substrate transport direction 6 of a substrate 4 from one into the second deposition area 7 (dashed line), enclose a rotation angle β which ranges of 90°. Each array 1 is adapted to the height profile of the substrate surface 22 as shown in FIG. 5A and FIG. 5B.

For deposition the substrate 4 is coated in two stages one after the other in the two deposition sections 31 having two deposition areas 7 as shown in FIG. 5C. During a first stage, the substrate surface 22 is deposited on a first deposition area 7 of the two deposition areas 7 by a first subset of the tubular cathodes 26. During a subsequent second stage, the substrate surface 22 is deposited again on a second deposition area 7 of the two deposition areas 7 by a second subset of the tubular cathodes 26 that differs from the first subset. While transferring the substrate 4 from the first deposition area 7 within the first deposition section 31 to the second deposition area 7 within the second deposition section 31 the substrate 4 rotates around an axis 28 that is parallel to a normal NS of the substrate reference surface 10 (FIG. 2).

By way of such arrangements, curved substrates 4 spanning 1.5 m, for instance, can evenly be coated with a maximum rise of 50 millimeters (mm) to significantly better than ±1.5%. In each of the two arrays, at least one pair of tubular cathodes 26 operated with alternating voltage or alternating current may be used in a known manner, which deposit layers of chemical compounds such as oxides or nitrides. Alternatively, other sputter sources can be used for such or comparable embodiments.

Figure 6:
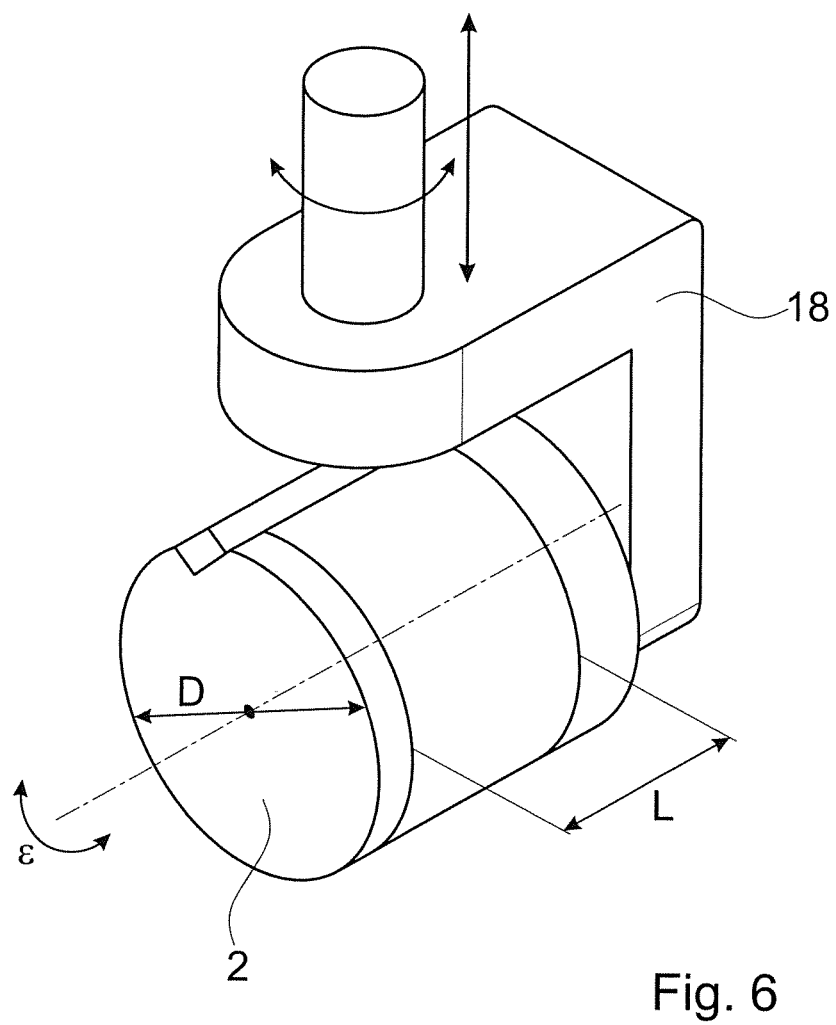
FIG. 6 is a schematic perspective view of a sputter source and a sputter support of a sputter device.

FIG. 6 shows a sputter source 2 with a source support 18, which is designed as a tubular magnetron and has a tube length L, which is comparable to its diameter D. In contrast to the described rotatables in FIG. 5A-5C, the magnetrons are short in this instance. Their rotatability and height adjustability are illustrated through arrows. The adjustability of the angles of the magnet system inside the tubular magnetron around the pivoting angle ε in order to change the orientation and/or the racetrack width of the sputter source, as described above, cannot be seen, but is implied through the indication of the angle. The ability to pivot around the angle ϑ is referred to in FIG. 3A and in its description. Arrays of such short magnetrons, each of which may be adjusted preferably within four geometric degrees of freedom, are used to evenly coat surfaces that are more strongly curved than those described in FIG. 5A-5C.

Illustrative, non-exclusive examples of inventive subject matter according to the present disclosure are described in the following enumerated paragraphs:

A1. Sputter device for the deposition of a layer by means of sputtering on a three-dimensionally shaped surface of a substrate or several thereof, in the following generally referred to as substrate surface, in one deposition area, whereby the sputter device the following components in one deposition section comprising:

at least one vacuum supply for the generation of a vacuum in the deposition section, a gas supply for the introduction and the production of process gas required for the sputter process in the deposition section, a substrate holding device for the support of the substrate relative to a substrate reference surface of the substrate holding device, several similar or different kinds of sputter sources, each of which are held by an individual source support and each of which has an individual reference point allocated on a sputter surface of the sputter source facing the deposition area, whereby the sputter sources, each spaced apart from each other, are arranged as a two-dimensional array, which is opposite the deposition area and extends along a source reference surface, which passes through at least one reference point and whose surface points each have the same surface distance to the substrate reference surface, and whereby at least one sputter source has a source distance to the source reference surface deviating from zero, which is measured between the source reference surface and the reference point of the sputter source along the normal of the source reference surface passing through this reference point.

A2. Sputter device for the deposition of a layer by means of sputtering on a three-dimensionally shaped surface of a substrate or several thereof, subsequently referred to as substrate surface, in two deposition areas, whereby the sputter device the following components in one or two deposition sections comprising:

at least one vacuum supply for the generation of a vacuum in each deposition section, a gas supply for the introduction of a process gas required for the sputter process in each deposition section, a substrate holding device or two thereof for the support of the substrate relative to each substrate reference surface of each substrate holding device, several tubular cathodes as sputter sources, each of which are held by one individual source support and each of which has an individual reference point allocated on a sputter surface facing the deposition area, whereby the sputter sources are arranged as two one-dimensional arrays of tubular magnetrons parallel adjacent and each spaced apart from each other, and the two axial directions of the tubular magnetrons of both arrays, along the transport path of a substrate from one to the second deposition area, have a rotation angle β in relation to each other which ranges from 0° to 90°, whereby each array is opposite one deposition area and each extends along one source reference surface, which passes through at least one reference point of the sputter sources of the relevant array, and whose surface points each have the same surface distance to the substrate reference surface, and whereby at least one sputter source has a source distance to the source reference surface deviating from zero, which is measured between the source reference surface and the reference point of the sputter source along the normal of the source reference surface passing through this reference point.

A3. A sputter device according to any of paragraphs A1-A2, whereby the normal of the sputter surface of at least one sputter source, which originates at the reference point of the sputter surface, has an inclination angle ϑ ranging from 0° to smaller than 90° relative to the normal of a section of the source reference surface to be assigned to the respective sputter source, and/or the sputter source may be rotated around its normal.

A4. A sputter device according to any of paragraphs A1-A3, whereby the source distance and/or a/the inclination angle ϑ of at least one sputter source may be varied by means of its source support and/or at least one sputter source which can be rotated around an axis passing through its reference point.

A5. A sputter device according to any of paragraphs A1-A4, whereby the substrate reference surface and the source reference surface are planar.

A6. A sputter device according to any of paragraphs A1-A5, whereby several vacuum supplies, as viewed from the substrate holding device, are distributed behind each array of the sputter sources.

A7. A sputter device according to any of paragraphs A1-A6, whereby the gas supply comprises one or more reactive gas supplies, which has a reactive gas inlet adjacent to a sputter source.

A8. A sputter device according to any one of paragraphs A1-A7, whereby mobile or stationary baffles are arranged within the space between one vacuum supply or several thereof and the sputter sources.

B1. A deposition method for the deposition of a layer by means of sputtering on a three-dimensionally shaped surface of a substrate or several thereof, in the following generally referred to as substrate surface, in one deposition area, whereby the deposition takes place by means of a sputter device according to any of paragraphs A1-A8.

B2. A deposition method according to paragraph B1, whereby the adjustment of the source distance and/or a/the inclination angle ϑ occurs independently through at least two sputter sources.

B3. A deposition method according to any of paragraphs B1-132, whereby the sputter sources of an array are operated at the same operating point.

B4. A deposition method according to any of paragraphs B1-133, whereby controlling of the sputter process takes place on the basis of a characteristics curve map and/or a transfer function, which are determined prior through computer-supported simulations or through deposition trials.

B5. A deposition method according to any of paragraphs B1-B4, whereby a subset of the sputter sources of an array is operated in one step of the method.

B6. A deposition method according to any of paragraphs B1-B5, whereby the deposition of a substrate surface takes place over two successive stages by depositing on the substrate surface during the first stage using a subset of the sputter sources of an array or using a first array and during the second stage using a second subset of the sputter sources, which deviates from the first subset, of the same array or using a second array, whereby the substrate undergoes a rotation around an axis parallel to the normal of the substrate reference surface while being transferred from the first to the second deposition area.

B7. A deposition method according to paragraph B6, whereby sub-areas of the substrate surface, which differ from each other, are coated during both stages of the deposition.

B8. A deposition method according to any of paragraphs B6-B7, whereby a transport of the substrate from the first deposition area of the first array to the second deposition area of the second array occurs, while maintaining the angular orientation of the substrate in a plane parallel to a transfer plane, in the case the deposition is carried out using two arrays.

C1. A sputter device for sputtering deposition of a layer on a three-dimensionally shaped substrate surface of a substrate in a deposition area, the sputter device comprising in a deposition section of the sputter device:

at least one vacuum supply for generation of a vacuum in the deposition section;

a gas supply for introduction of process gas for the sputtering deposition in the deposition section;

a substrate holding device for support of the substrate relative to a substrate reference surface of the substrate holding device; and sputter sources, each of which is held by an individual source support, each of which has an individual reference point allocated on a sputter surface facing the deposition area, and each of which has a source distance to a source reference surface from the individual reference point, wherein the sputter sources are spaced apart from each other, are arranged as a two-dimensional array opposite the deposition area, and extend along the source reference surface, wherein the source reference surface is parallel to the substrate reference surface, wherein at least one of the sputter sources has a source distance deviating from zero, and wherein the source distance is measured between the source reference surface and the individual reference point of the at least one of the sputter sources along a normal of the source reference surface passing through the individual reference point.

C2. The sputter device of paragraph C1, wherein a normal of the sputter surface of at least one of the sputter sources, which originates at the individual reference point, has an inclination angle ϑ ranging from 0° to smaller than 90° relative to a normal of a section of the source reference surface associated with the at least one of the sputter sources.

C3. The sputter device of paragraph C2, wherein the inclination angle ϑ is variable by way of the individual source support.

C4. The sputter device of any of paragraphs C2-C3, wherein the inclination angles ϑ of at least two of the sputter sources are independently adjustable.

C5. The sputter device of any of paragraphs C1-C4, wherein at least one of the sputter sources is rotatable around a/the normal of the sputter surface of the at least one of the sputter sources.

C6. The sputter device of any of paragraphs C1-C5, wherein the source distance is variable by way of the individual source support.

C7. The sputter device of any of paragraphs C1-C6, wherein the gas supply comprises one or more reactive gas supplies that each has a reactive gas inlet adjacent to a sputter source of the sputter sources.

C8. The sputter device of any of paragraphs C1-C7, further comprising mobile or stationary baffles arranged within a space between the at least one vacuum supply and the sputter sources.

C9. The sputter device of any of paragraphs C1-C8, wherein the source distances of at least two of the sputter sources are independently adjustable.

C10. The sputter device of any of paragraphs C-C9, wherein the source distance of the at least one of the sputter sources that has a source distance deviating from zero is adjustable, optionally by its individual source support.

C11. The sputter device of any of paragraphs C1-C10, wherein the sputter sources are operable at the same operating point whereby a reactive gas mass flow and a power are in substantially the same ratio so that layers of substantially the same stoichiometry or substantially the same refractive index are deposited.

C12. The sputter device of any of paragraphs C-C11, wherein the at least one vacuum supply comprises several vacuum supplies that are distributed behind the sputter sources, as viewed from the substrate holding device.

C13. The sputter device of any of paragraphs C-C12, wherein the at least one vacuum supply is configured to produce the process gas.

D1. A method comprising controlling the sputter device of any of paragraphs C1-C13, wherein the controlling takes place on a basis of a characteristics curve map or a transfer function determined prior through computer-supported simulations or through deposition trials.

E1. A sputter device for sputtering deposition of a layer on a three-dimensionally shaped substrate surface of a substrate in two deposition areas, the sputter device comprising in one or two deposition sections of the sputter device:
    at least one vacuum supply for generation of a vacuum in each deposition section;
    a gas supply for introduction of a process gas for the sputtering deposition in each deposition section;
    one or two substrate holding devices for the support of the substrate relative to a substrate reference surface of each substrate holding device; and
    tubular cathodes as sputter sources, each of which is held by one individual source support and each of which has an individual reference point allocated on a sputter surface facing the deposition area, wherein the sputter sources are arranged as two one-dimensional arrays of tubular magnetrons that are parallel and adjacent to each other and that are spaced apart from each other, wherein axial directions of the tubular magnetrons of both arrays, along a transport path of the substrate between the two deposition areas, have a rotation angle β in relation to each other which ranges from 0° to 90°, wherein each array is opposite one deposition area of the two deposition areas and each extends along a source reference surface that passes through at least one reference point of the sputter sources of the respective array, and wherein the source reference surface is parallel to the substrate reference surface, and wherein at least one of the sputter sources has a source distance to the source reference surface deviating from zero, and wherein the source distance is measured between the source reference surface and the reference point of the at least one of the sputter sources along the normal of the source reference surface passing through the reference point.

E2. The sputter device of paragraph E1, wherein a normal of the sputter surface of at least one of the sputter sources, which originates at the individual reference point, has an inclination angle ϑ ranging from 0° to smaller than 90° relative to a normal of a section of the source reference surface associated with the at least one of the sputter sources.

E3. The sputter device of paragraph E2, wherein the inclination angle ϑ is variable by way of the individual source support.

E4. The sputter device of any of paragraphs E2-E3, wherein the inclination angles θ of at least two of the sputter sources are independently adjustable.

E5. The sputter device of any of paragraphs E1-E4, wherein the source distance is variable by way of the individual source support.

E6. The sputter device of any of paragraphs E1-E5, wherein the at least one vacuum supply comprises several vacuum supplies that are distributed behind each array of the sputter sources, as viewed from the substrate holding device.

E7. The sputter device of any of paragraphs E1-E6, wherein the gas supply comprises one or more reactive gas supplies that each has a reactive gas inlet adjacent to a sputter source of the sputter sources.

E8. The sputter device of any of paragraphs E1-E7, further comprising mobile or stationary baffles arranged within a space between the at least one vacuum supply and the sputter sources.

E9. The sputter device of any of paragraphs E1-E8, wherein the source distances of at least two of the sputter sources are independently.

E10. The sputter device of any of paragraphs E1-E9, wherein the sputter sources are operable at the same operating point whereby a reactive gas mass flow and a power are in substantially the same ratio so that layers of substantially the same stoichiometry or substantially the same refractive index are deposited.

F1. A method comprising controlling the sputter device of any of paragraphs E1-E10, wherein the controlling takes place on a basis of a characteristics curve map or a transfer function determined prior through computer-supported simulations or through deposition trials.

G1. A method comprising operating the sputter device of any of paragraphs E1-E10, wherein the operating comprises:
    during a first stage, depositing on a first of the two deposition areas by a first subset of the sputter sources;
    during a subsequent second stage, depositing on a second of the two deposition areas by a second subset of the sputter sources that differs from the first subset; and
    rotating the substrate around an axis that is parallel to the normal of the substrate reference surface while transferring the substrate from the first deposition area the second deposition area.

G2. The method of paragraph G1, wherein sub-areas of the substrate surface that differ from each other are coated during both the first stage and the second stage.

G3. The method of any of paragraphs G1-G2, wherein the transferring the substrate from the first deposition area to the second deposition area is performed within a transfer plane and occurs while maintaining an angular orientation of the substrate in a substrate plane that is parallel to the transfer plane.

G4. The method of any of paragraphs G1-G3, further comprising controlling the sputter device, wherein the controlling takes place on a basis of a characteristics curve map or a transfer function determined prior through computer-supported simulations or through deposition trials.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

The invention claimed is:

1. A sputter device for sputtering deposition of a layer on a three-dimensionally shaped substrate surface of a substrate in a deposition area, the sputter device comprising in a deposition section of the sputter device:
   at least one vacuum supply for generation of a vacuum in the deposition section;
   a gas supply for introduction of process gas for the sputtering deposition in the deposition section;
   a substrate holding device for support of the substrate relative to a substrate reference surface of the substrate holding device; and
   sputter sources, each of which is held by an individual source support, each of which has an individual reference point allocated on a sputter surface facing the deposition area, and each of which has a source distance to a source reference surface from the individual reference point, wherein the sputter sources are spaced apart from each other, are arranged as a two-dimensional array opposite the deposition area, and extend along the source reference surface, wherein the source reference surface is parallel to the substrate reference surface, wherein at least one of the sputter sources has a source distance deviating from zero, wherein the source distance is measured between the source reference surface and the individual reference point of the at least one of the sputter sources whose source distance deviates from zero along a normal of the source reference surface passing through the individual reference point, and wherein at least one of the sputter sources is rotatable around a normal of the sputter surface of the at least one of the sputter sources that is rotatable.

2. The sputter device of claim 1, wherein the normal of the sputter surface of the at least one of the sputter sources whose source distance deviates from zero, which originates at the individual reference point, has an inclination angle $\vartheta$ ranging from 0° to smaller than 90° relative to a normal of a section of the source reference surface associated with the at least one of the sputter sources whose source distance deviates from zero.

3. The sputter device of claim 2, wherein the inclination angle $\vartheta$ is variable by way of the individual source support.

4. The sputter device of claim 2, wherein the inclination angles $\vartheta$ of at least two of the sputter sources are independently adjustable.

5. The sputter device of claim 1, wherein the source distance is variable by way of the individual source support.

6. The sputter device of claim 1, wherein the gas supply comprises one or more reactive gas supplies that each has a reactive gas inlet adjacent to a sputter source of the sputter sources.

7. The sputter device of claim 1, further comprising mobile or stationary baffles arranged within a space between the at least one vacuum supply and the sputter sources.

8. The sputter device of claim 1, wherein the source distances of at least two of the sputter sources are independently adjustable.

9. The sputter device of claim 1, wherein the source distance of the at least one of the sputter sources whose source distance deviates from zero is adjustable.

10. The sputter device of claim 1, wherein the sputter sources are operable at the same operating point whereby a reactive gas mass flow and a power are in substantially the same ratio so that layers of substantially the same stoichiometry or substantially the same refractive index are deposited.

11. The sputter device of claim 1, wherein the at least one vacuum supply comprises several vacuum supplies that are distributed behind the sputter sources, as viewed from the substrate holding device.

12. The sputter device of claim 1, wherein the gas supply is configured to produce the process gas.

13. A method comprising controlling the sputter device of claim 1, wherein the controlling takes place on a basis of a characteristics curve map or a transfer function determined prior through computer-supported simulations or through deposition trials.

14. The sputter device of claim 1, wherein the sputter sources are tubular sputter sources.

15. The sputter device of claim 1, wherein the sputter sources are planar sputter sources.

16. The sputter device of claim 15, wherein the planar sputter sources are circular planar sputter sources.

17. A sputter device for sputtering deposition of a layer on a three-dimensionally shaped substrate surface of a substrate in a deposition area, the sputter device comprising in a deposition section of the sputter device:
   at least one vacuum supply for generation of a vacuum in the deposition section;
   a gas supply for introduction of process gas for the sputtering deposition in the deposition section;
   a substrate holding device for support of the substrate relative to a substrate reference surface of the substrate holding device; and
   planar sputter sources, each of which is held by an individual source support, each of which has an individual reference point allocated on a sputter surface facing the deposition area, and each of which has a source distance to a source reference surface from the individual reference point, wherein the planar sputter sources are spaced apart from each other, are arranged as a two-dimensional array opposite the deposition area, and extend along the source reference surface, wherein the source reference surface is parallel to the substrate reference surface, wherein at least one of the planar sputter sources has a source distance deviating from zero, and wherein the source distance is measured between the source reference surface and the individual reference point of the at least one of the planar sputter sources along a normal of the source reference surface passing through the individual reference point.

18. The sputter device of claim 17, wherein the planar sputter sources are circular planar sputter sources.

\* \* \* \* \*